United States Patent
Razdan et al.

(10) Patent No.: US 6,199,153 B1
(45) Date of Patent: Mar. 6, 2001

(54) METHOD AND APPARATUS FOR MINIMIZING PINCOUNT NEEDED BY EXTERNAL MEMORY CONTROL CHIP FOR MULTIPROCESSORS WITH LIMITED MEMORY SIZE REQUIREMENTS

(75) Inventors: Rahul Razdan, Princetwon; Solomon J. Katzman, Waltham; James B. Keller, Waltham; Richard E. Kessler, Shrewsbury, all of MA (US)

(73) Assignee: Digital Equipment Corporation, Maynard, MA (US)

( * ) Notice: Subject to any disclaimer, the term of this patent is extended or adjusted under 35 U.S.C. 154(b) by 0 days.

(21) Appl. No.: 09/099,383

(22) Filed: Jun. 18, 1998

(51) Int. Cl.[7] ...................................................... G06F 12/00
(52) U.S. Cl. ............................. 711/212; 710/126; 711/172
(58) Field of Search ................................ 710/66, 74, 127; 711/212, 201, 210

(56) References Cited

U.S. PATENT DOCUMENTS 4,675,808 * 6/1987 Grinn et al. ........................ 364/200
5,802,603 * 6/1987 Bains et al. ........................ 711/202
5,893,932 * 4/1999 Dey et al. ........................... 711/211
5,895,503 * 6/1987 Belgard .............................. 711/202

* cited by examiner

Primary Examiner—John W. Cabeca
Assistant Examiner—Pierre M. Vital
(74) Attorney, Agent, or Firm—Conley, Rose & Tayon, P.C.

(57) ABSTRACT

A computing apparatus has a mode selector configured to select one of a long-bus mode corresponding to a first memory size and a short-bus mode corresponding to a second memory size which is less than the first memory size. An address bus of the computing apparatus is configured to transmit an address consisting of address bits defining the first memory size and a subset of the address bits defining the second memory size. The address bus has N communication lines each configured to transmit one of a first number of bits of the address bits defining the first memory size in the long-bus mode and M of the N communication lines each configured to transmit one of a second number of bits of the address bits defining the second memory size in the short-bus mode, where M is less than N.

21 Claims, 3 Drawing Sheets

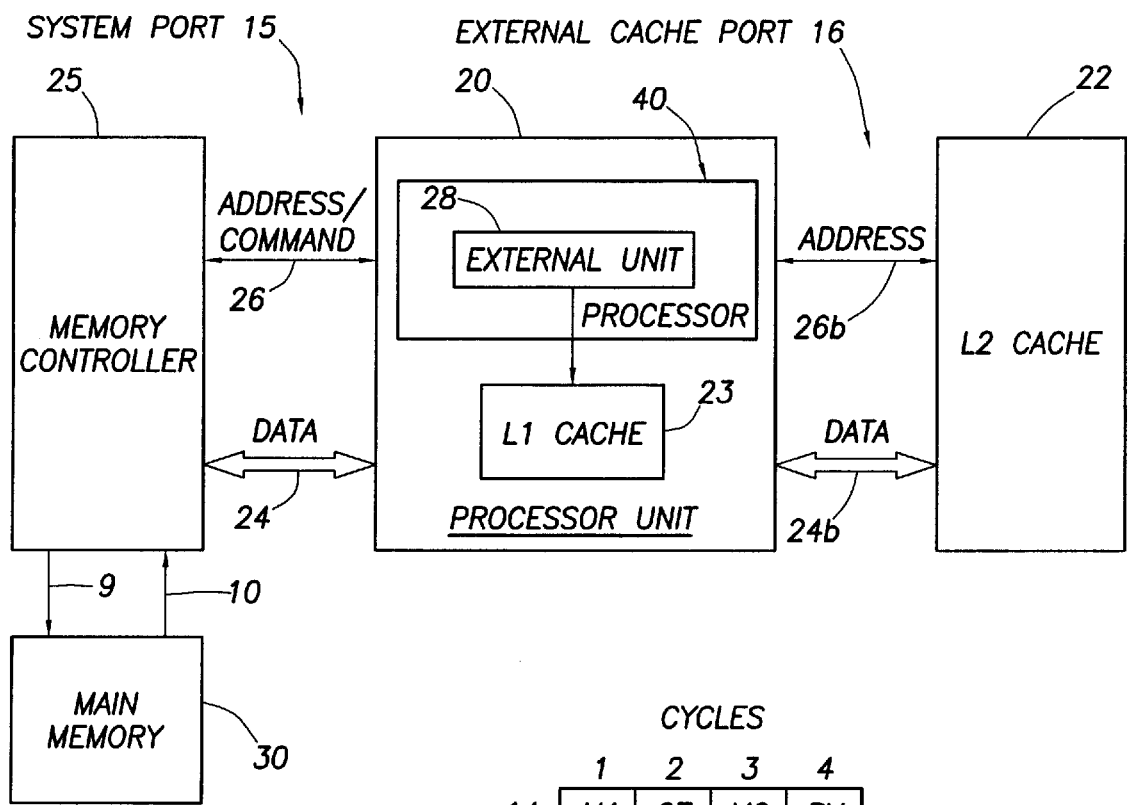

METHOD AND APPARATUS FOR MINIMIZING PINCOUNT NEEDED BY EXTERNAL MEMORY CONTROL CHIP FOR MULTIPROCESSORS WITH LIMITED MEMORY SIZE REQUIREMENTS

CROSS-REFERENCE TO RELATED APPLICATIONS

This Application relates to the applications entitled:

METHOD AND APPARATUS FOR PERFORMING SPECULATIVE MEMORY REFERENCES TO THE MEMORY INTERFACE (U.S. application Ser. No. 09/099,399, filed Jun. 18, 1998) and METHOD AND APPARATUS FOR RESOLVING PROBES IN MULTIPROCESSOR SYSTEMS WHICH DO NOT USE EXTERNAL DUPLICATE TAGS FOR PROBE FILTERING (U.S. application Ser. No. 09/099,400, filed Jun. 18, 1998) and METHOD AND APPARATUS FOR PERFORMING SPECULATIVE MEMORY FILLS INTO A MICROPROCESSOR (U.S. application Ser. No. 09/099,396, filed Jun. 18, 1998) and METHOD AND APPARATUS FOR DEVELOPING MULTIPROCESSOR CACHE CONTROL PROTOCOLS USING ATOMIC PROBE COMMANDS AND SYSTEM DATA CONTROL RESPONSE COMMANDS (U.S. application Ser. No. 09/099/398, filed Jun. 18, 1998) and METHOD AND APPARATUS FOR DEVELOPING MULTIPROCESSOR CACHE CONTROL PROTOCOLS USING AN EXTERNAL ACKNOWLEDGMENT SIGNAL TO SET A CACHE TO A DIRTY STATE (U.S. application Ser. No. 09/099,384, filed Jun. 18, 1998) and METHOD AND APPARATUS FOR DEVELOPING MULTIPROCESSOR CACHE CONTROL PROTOCOLS BY PRESENTING A CLEAN VICTIM SIGNAL TO AN EXTERNAL SYSTEM (U.S. application Ser. No. 09/099, 304, filed Jun. 18, 1998) and METHOD AND APPARATUS FOR DEVELOPING MULTIPROCESSOR CACHE CONTROL PROTOCOLS USING A MEMORY MANAGEMENT SYSTEM GENERATING ATOMIC PROBE COMMANDS AND SYSTEM DATA CONTROL RESPONSE COMMANDS (U.S. application Ser. No. 09/099,385, filed Jun. 18, 1998) and METHOD AND APPARATUS FOR DEVELOPING MULTIPROCESSOR CACHE CONTROL PROTOCOLS USING A MEMORY MANAGEMENT SYSTEM GENERATING AN EXTERNAL ACKNOWLEDGMENT SIGNAL TO SET A CACHE TO A DIRTY COHERENCE STATE (U.S. application Ser. No. 09/099,386, filed Jun. 18, 1998) and METHOD AND APPARATUS FOR DEVELOPING MULTIPROCESSOR CACHE CONTROL PROTOCOLS USING A MEMORY MANAGEMENT SYSTEM TO RECEIVE A CLEAN VICTIM SIGNAL (U.S. application Ser. No. 09/099,387, filed Jun. 18, 1998).

These applications are filed simultaneously herewith in the U.S. Patent & Trademark Office.

TECHNICAL FIELD

The present invention relates generally to computer processor technology, and more particularly to memory subsystems for a multiprocessor system.

BACKGROUND ART

One popular multiprocessor computer architecture is formed by coupling one or more processors to a shared main memory storing data, with each processor typically having a local cache to store its own private copy of a subset of the data from the main memory.

In the above architecture, a separate memory control chip connecting the processors to the main memory manages the operations necessary to access memory from any one of the processors. For example, if one of the processors makes a reference to memory to access data, the control chip will schedule a read of the data corresponding to the reference from the main memory while simultaneously scheduling system probes to the other processors to check for the presence of this address in the other processors' caches.

To connect to the processors of a multiprocessor system, the control chip requires 2*BW*N pins for an N processor system with BW bits for each of two address buses, i.e., the address-out bus for communicating the address of the memory reference from the processor to the control chip, and the address-in bus used by the control chip to send an address of a probe into each of the processors. If BW is large, the control chip can quickly become pin-limited and cannot handle even a reasonable number of processors.

As the size of the multiprocessor system increases, so does the pin count on the memory control chip. Thus, techniques have been proposed which reduce the number of pins located on a processor chip required to connect the processor chip to the control chip, and thereby reduce the total number of pins required on the control chip.

Additionally, with computer processor technology improvements, the total available address space increases, thus typically resulting in more pins on a processor chip to support the larger address bus (i.e., BW increases). It has been observed that many microprocessor systems have limited memory size requirements in that they do not require the maximum addressable memory space provided by the processor architecture. However, even in a multiprocessor system addressing a scaled-down memory space, a microprocessor with a single address bus for all memory size requirements will still require all the address pins be connected to the control chip even though a lesser number of pins are actually needed.

Thus, it is desired to reduce the pin count of the memory control chip for a multiprocessor system with a limited memory size requirement by providing a microprocessor which permits a designer to select an address bus supporting one of a maximum memory size requirement and a small memory size requirement.

SUMMARY DISCLOSURE OF THE INVENTION

The present invention overcomes the foregoing and other problems by providing a computing apparatus having a mode selector configured to select one of a long-bus mode corresponding to a first memory size and a short-bus mode corresponding to a second memory size which is less than the first memory size. Preferably, the first memory size is a maximum memory size and the second memory size is a scaled-down memory size. An address bus of the computing apparatus is configured to transmit an address consisting of address bits defining the first memory size and a subset of the address bits defining the second memory size. The address bus has N communication lines each configured to transmit one of a first number of bits of the address bits defining the first memory size in the long-bus mode. M of the N communication lines are each configured to transmit one of a second number of bits of the address bits defining the second memory size in the short-bus mode. M is less than N. The computing apparatus has N pins, each of the pins respectively attached to a corresponding one of the N communication lines. Thus, the computing apparatus enables a system designer to connect the computing apparatus to a memory controller of a multiprocessor system employing M of the N pins in the short-bus mode, thus reducing the total pincount needed by the memory controller managing a scaled-down memory.

In a further aspect of the present invention an encoder of the computing apparatus provides an encoded packet serving as a vehicle by which an address may be transmitted over a short bus. The encoder arranges the address bits of the address into the encoded packet so that, in short-bus mode, the address bits defining the second memory size are transmitted over the M communications lines of the address bus.

In another aspect of the present invention, the encoder is further configured to map the address bits into an encoded packet forming an array having N rows and C columns, each row and column defining a cell of the packet. Each address bit of the address bits is allocated to at least one of the cells. Preferably, one or more of the cells of the packet includes bits defining command information, and one or more of the other cells of the packet includes bits defining control information. Typically, at least one of the cells of the packet contains a bit indicating a probe miss.

According to another aspect, a time multiplexer of the computing apparatus is configured to transmit the cells of the packet over the address bus in C time cycles. One of the columns of cells is transmitted during one of the C time cycles, the cells in the N rows of the one column being transmitted over the N communication lines in the one time cycle.

In yet another aspect of the present invention, the mode selector of the computing apparatus is further configured to select a third memory size which is less than the first memory size. The address bus of the computing apparatus is further configured to transmit an address consisting of a subset of the address bits defining the third memory size. P of the N communication lines of the address bus are each further configured to transmit one of a third number of bits of the address bits defining the third memory size in the short-bus mode, where P is less than N. Thus, preferably, the computing apparatus may be configured to select one or more memory sizes for the short-bus mode.

In another feature of the invention, the encoded packet is divided into a plurality of parts, each part containing a portion of the address bits arranged so that the address defining the second memory size is transmitted over M of the communication lines. A time multiplexer is configured to transmit the encoded packet defining the second memory size over the M communications lines of the address bus by transmitting one of the parts per a time cycle.

In yet another feature, while in the short-bus mode, an address may be generated to a memory greater than the second memory size because of operating system and other such errors. This memory which is greater than the second memory size, i.e. the addressable memory of the short-bus, is denoted as non-existent memory. A non-existent memory detection unit detects an address referenced to non-existent memory and a handling unit then recovers from this error by canceling the address to non-existent memory and performing other recovery tasks.

In yet another aspect of the method of the present invention, the address bits of the address are partitioned to form a predetermined group of lower-order address bits and a predetermined group of higher-order address bits. The address bits consisting of the concatenation of the lower-order address bits and the higher order address bits define a first address space and the lower-order. address bits define a second address space. The encoded packet is arranged into C columns, each column consisting of N rows, each column and row defining a cell. A portion of the bits of the address are then allocated to cells in each one of the plurality of columns, including mapping the higher-order address bits to the cells of the columns so that rows 1 to M contain the lower-order address bits forming the second address space wherein M is less than N.

The present invention further provides a multiprocessor system including a plurality of processor chips and a control chip connecting these processor chips to a main memory. Each processor chip has a mode selector configured to select one of a main memory having a first memory size and a main memory having a second memory size which is less than the first memory size. N pins of each processor chip are configured to transmit an address to the control chip corresponding to the first memory size. M of the N pins are configured to transmit an address to the control chip corresponding to the second memory size. In a further aspect, an encoder of each processor chip is configured to transform the address into an encoded packet so that the address corresponding to the first memory size transmits over the N pins to the control chip and the address corresponding to the second memory size transmits over the M pins to the control chip, where M is less then N.

Objects, advantages, novel features of the present invention will become apparent to those skilled in the art from this disclosure, including the following detailed description, as well as by practice of the invention. While the invention is described below with reference to a preferred embodiment (s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF DRAWINGS

FIG. 2 is a block diagram of a computer system with an L1 and L2 cache in accordance with the present invention.

FIG. 5 illustrates a memory reference command according to an embodiment of the present invention.

BEST MODE FOR CARRYING OUT THE INVENTION

Figure 1:
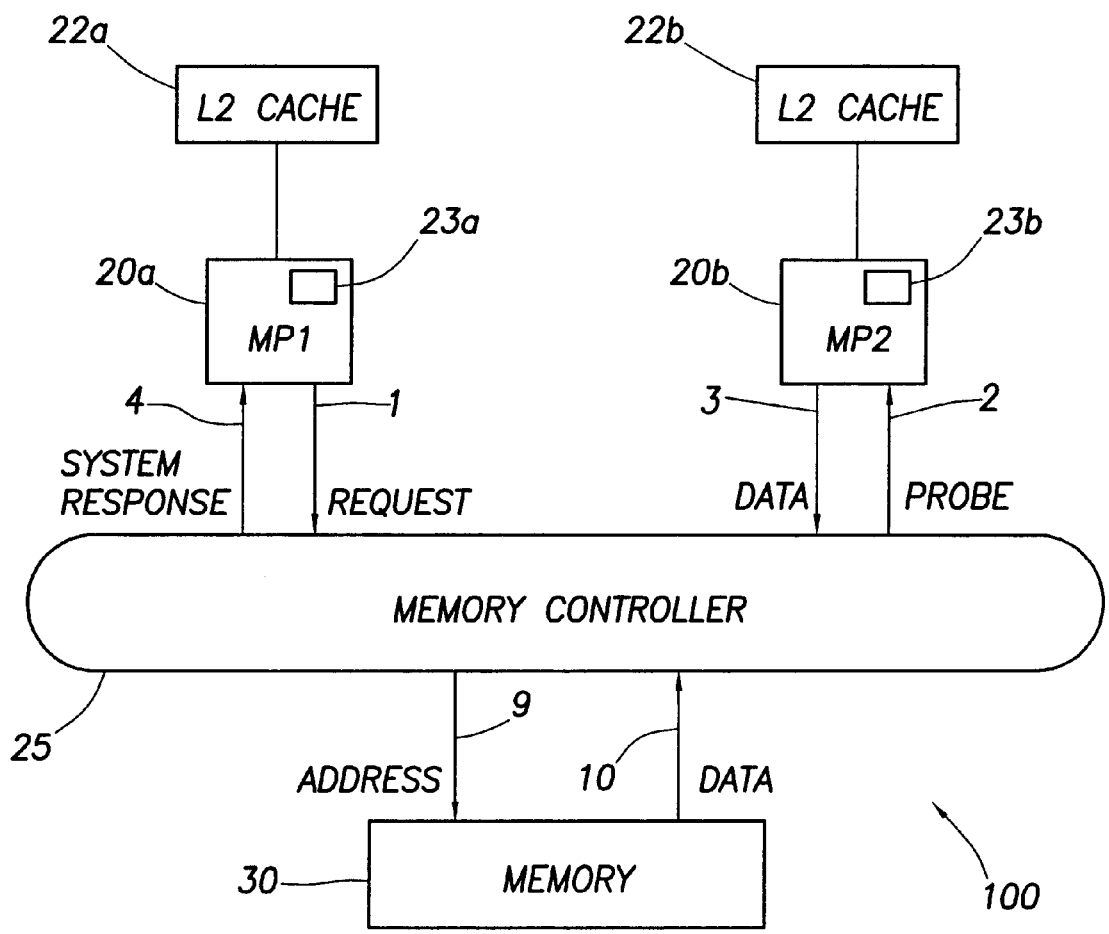
FIG. 1 is a multiprocessor shared memory system in accordance with the present invention.

FIG. 1 illustrates a multiprocessor system 100 which includes two or more processors 20, a memory controller 25 and a main memory 30. In the preferred embodiment, the processors 20 are microprocessors. In FIG. 1, two processors MP 20*a* and MP2 20*b* are shown for the purpose of illustration, but such a multiprocessor system may have two or more processors. In the preferred embodiment, a processor 20 may have more than one cache, including separate caches for instructions (not shown) and data. A cache may further be distinguished as being on the same chip (L1 cache) as the processor or externally connected to the processor chip via a cache bus (L2 cache). FIG. 1 shows processor 20a coupled to L1 cache 22a and containing internal L1 cache 23a. Processor 20b is coupled to external cache 22b and contains internal L1 cache 23b.

Preferably, the memory 30 is a group of main memory modules holding memory shared by the processors of the multiprocessor system 25. The memory 30 forms a common address space referenced by the processors 20.

The memory controller 25 contains data and address buses for coupling the microprocessors and memory, as well as additional logic for implementing a coherence protocol for assuring the coherency of data distributed throughout the main memory 30 and caches 22 and 23. The memory controller 25 implements a particular cache coherence protocol chosen by a system designer for the multiprocessor system. The memory controller 25 may range in complexity from simple to complex depending on the particular protocol implemented. The memory controller 25 could be a single bus or switch system connecting the processors to main memory with additional logic added to implement the protocol. The memory controller could, for example, have its own processor and additional data structures needed to implement a directory cache protocol. Cache protocols, such as the directory cache protocol, are well known to one of ordinary skill in the computing arts.

In one possible implementation of a multiprocessor cache control protocol according to the present invention, in a typical memory access sequence, microprocessor 20a makes a memory request 1 to memory controller 25 requesting a block of memory from main memory 30. The memory controller 25 converts memory request 1 into a probe 2 and sends probe 2 to each microprocessor 20b to determine whether the memory block is present in one of the caches. In this example, the memory block is in cache 22b or 23b of microprocessor 20b, and thus microprocessor 20b issues a probe response 3 returning the block of data 3 to the memory controller 25. The memory controller 25 then forms a system response 4 sending the block to microprocessor 20a which originally requested it. Alternately, if the block was not present in any of the caches, the memory controller 25 would retrieve the memory block 10 corresponding to address 9 from main memory 30 and transfers it by the system response 4 to the requesting microprocessor 20a. Thus, in this particular protocol, before the system 25 checks the main memory 30, it first checks the memory from each cache of the other processors to make sure that the request gets the latest copy.

FIG. 2 shows a computer system having a processor unit (or microprocessor) 20, a memory controller 25, a main memory 30, and an L2 cache 22. The processor unit 20 transmits and receives information from memory controller 25 via system port 15. System port 15 includes a address/command bus 26 and a data bus 24. Generally, the system port 15 may interface with any external system, that is, any system linking the processor unit 20 to external devices, such as input/output devices. The memory controller is an external system which manages memory in a uniprocessor or multiprocessor system.

The processor unit 20 transmits and receives information from an external L2 cache 22 via the external cache port 16. The external cache port 16 includes an address bus 26b and a data bus 24b.

The external cache port 16 connects the processor unit 20 to an external cache 22, commonly referred to as the L2 cache. The external cache port 16 includes bidirectional data bus 24b and an address bus 26b. Processor unit 20 contains a processor 40 coupled to an L1 cache 23. In a preferred embodiment, processor 40 and L1 cache 23 are embedded on the same processor chip (denoted herein as processor unit 20), and the L2 cache is a separate chip or chips located externally to the processor chip and connected to the processor chip through cache port 16.

The system port 15 is composed of a bidirectional data bus 24 and two address/command buses 26. The address/command buses 26 transmits both command and address information between the memory controller 25 and the processor unit 20. The command and address information is time multiplexed onto the address/command buses in order to reduce pin count on the processor chip.

The memory controller 25 interfaces the processor unit 20 to the main memory 30. The memory controller 25 references main memory 30 via an address bus 9 and receives data from main memory via a data bus 10.

When the processor unit 20 desires to access main memory 30 to retrieve data, the external unit 28 generates an external memory reference in the form of a command to the memory controller 25 through the address/command bus 26. The external memory reference typically includes a five bit command opcode specifying the type of memory reference and an address pointing to a location in memory. The memory controller 25 handles the command by transmitting the address via the address bus 9 and retrieving the data from main memory 30 over the data bus 10. The memory controller 25 then transmits the data to the processor 20 on the data bus 24.

Figure 3:
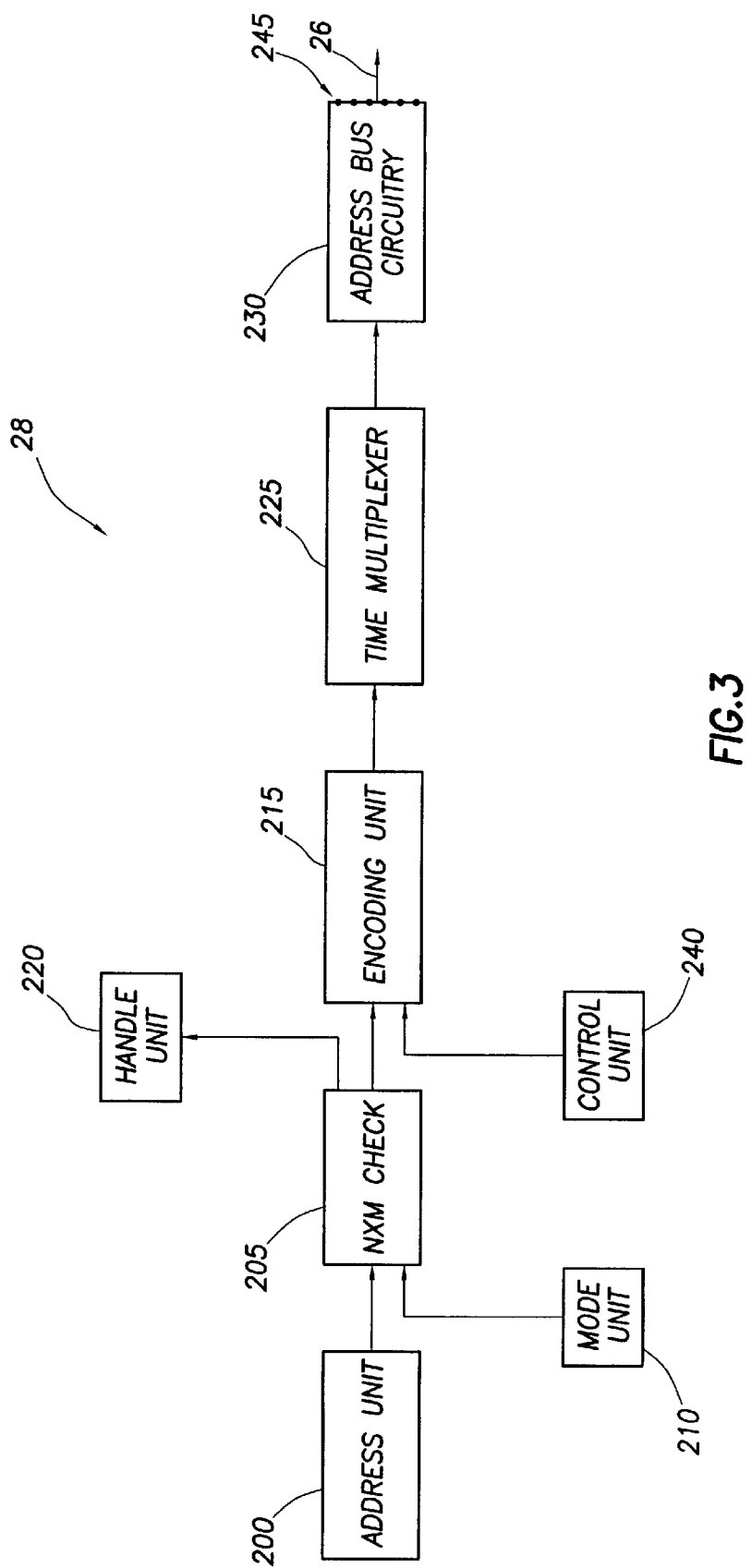
FIG. 3 is a block diagram of an apparatus for generating an access to memory according to the present invention.

FIG. 3 shows an apparatus for minimizing pin count according to the present invention, as part of the external unit 28, including an address generation unit 200, a non-existent memory unit (NXM) 205, a mode unit 210, an error handling unit 220, an encoding unit 215, a control unit 240, a time multiplexer 225, and address bus circuitry 230 having communication lines 26 and their corresponding pins 245.

The address generation unit 200 generates an address having address bits. The address bits point to a number of distinct addressable sections of memory herein referred to as the address space. The address space has a size of 2 raised to the power of the number of address bits. For example, an address with 8 bits would be able to address 256 separate segments. Generally, a segment may be a bit, a byte, a word, a longword, a quadword, or any other similar resolution.

In the present embodiment, the address generation unit 200 produces a 42 bit address defining a maximum addressable memory space and a 36 bit and a 34 bit address defining two small address spaces. The mode module 210 allows an operator to select one of the above-mentioned address spaces.

The non-existent memory unit 205 checks the address from the address generation unit 200 to see if it is compatible with the particular mode of operation. This is necessary because the processor may generate a memory reference outside the bounds of the known memory due to operating system error or a speculative reference. In a short-bus mode, where all of the pins are not being addressed, a reference to memory outside the know memory will map into the known memory causing a fatal error. The memory controller cannot detect this situation because the memory controller does not have signals available from all of the pins and thus does not receive the higher order bits. To prevent this fatal error, the non-existent memory unit 205 checks a memory reference to a memory larger than the currently used address space and if the memory reference exceeds this value, control is transferred to the error handle unit 220. When the non-existent memory unit 205 does not detect an error, processing continues normally with the address passing to the encoding unit 215.

The encoding unit 215 accepts as input the 42 bit address from the address generator unit 200 and a 5 bit command indicating the type of memory reference and various control bits from the control unit 240. The encoding unit 215 then arranges these command, control, and address bits into a command packet, an example of which is shown in FIG. 5. In particular, as shown in FIG. 5, the encoding unit arranges the address bits so that the smaller address spaces may be communicated using fewer pins.

Figure 4:
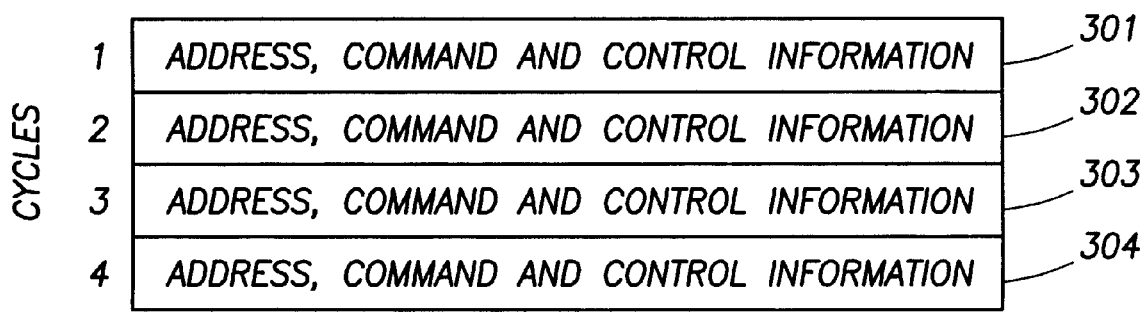
FIG. 4 illustrates a format for a memory reference command according to the present invention.

FIG. 4 discloses the format of the command packet occurring at the output of the encoder according to the present invention. The command packet is divided into four parts 301–304, each part containing 15 bits of command, control, or address information.

FIG. 5 discloses the details of the command packet of FIG. 4. FIG. 5 shows an embodiment of a particular encoding of a command/address packet according to the present invention. Each one of the four parts of the packet corresponds to a cycle of the system clock in which the part is transmitted to the external system, e.g. the memory controller.

The first packet part corresponding to cycle 1 contains 15 bits of information transmitted over the address lines 0–14. The bit "M1" reports a miss to the system corresponding to a previous probe command. The bits C0–C4 are the five bits of the command field. The bits 28–34 and bits 36 and 38 are physical address bits making up the 42 bit address.

The second packet part corresponding to cycle 2 contains physical address bits 22–27, 6–12, 35 and 37.

The third packet part corresponding to cycle 3. The third part contains bit "M2" for reporting another miss corresponding to a previous probe command. With the "M1" bit of cycle 1 and the "M2" bit of cycle 3, the processor may report two probe misses per packet to the memory controller. By using these two bits, a probe miss can be reported to the memory controller without using a separate probe command. Since most probe commands result in misses, this is a highly efficient optimization. The bits "M1" and "M2" may be generated by the control unit 240 which has circuitry to keep track of a queue of probes and the cache state. This packet also contains mask bits m0–m7 signaling mask information to the memory controller associated with input/output commands. The third part also contains a CH bit reporting to the memory controller that the cache hit, but there is no corresponding data movement. Additionally, the third part contains ID bits ID0–ID2 which are used as pointers to internal registers of the processor. Additionally, the third part contai ns address bits 40 and 42.

The fourth packet part corresponds to cycle 4. The fourth part contains a bit "RV" reporting to the memory controller whether the command is valid or not. Additionally, the fourth part contains physical address bits 13–21, 3–5, and 39 and 41.

The mode unit 210 indicates either a long-bus format or one or more short-bus format. This allows system designers to minimize pin count for systems with small memory, by configuring a short-bus format. The above encoding permits a long-bus format and two short-bus formats. In other embodiments, there may be more short-bus formats. Referring to FIG. 5, one short-bus format is configured when pin 0 is not used. In this case, the system can address up to physical address 36. In a second short-bus format, when pins 0 and 1 are not used, the system can use up to physical address 34. The short-bus formats are made possible by the particular encoding illustrated in FIG. 5.

In a general embodiment of the present invention, an encoded packet, such as in FIG. 5, may be constructed by partitioning the address bits to form a predetermined group of lower-order address bits and a predetermined group of higher-order address bits where the lower-order address bits define a scaled-down address space. The encoded packet is arranged into C columns, each column consisting of N rows, each column and row defining a cell. A portion of the bits of the address are then allocated to cells in each one of the plurality of columns. The higher-order address bits are mapped to the cells of the columns so that rows 1 to M contain the lower-order address bits to form the scaled-down address space, where M is less than N.

The time multiplexer 225 transmits each of the four packet parts to the address bus circuitry 230 over the four time cycles. The address bus circuitry 230 has 15 communications lines connected to 15 pins located on the chip of the processor unit. During each of four time cycles, the time multiplexer 225 of processor 20 sends a packet part 301–304 over the 15 communication lines of the address/command bus 26 to memory controller 25. The pins 245, connected to the communication lines of the address bus 230, form part of the address bus and are the electrical connection points of the processor integrated circuit.

What is claimed is:

1. A computing apparatus, comprising:
    a mode selector configured to select one of a long-bus mode corresponding to a first memory size and a short-bus mode corresponding to a second memory size which is less than the first memory size;
    an address bus configured to transmit an address consisting of address bits defining the first memory size and a subset of the address bits defining the second memory size;
    wherein the address bus has N communication lines each configured to transmit one of a first number of bits of the address bits defining the first memory size in the long-bus mode and M of the N communication lines each configured to transmit one of a second number of bits of the address bits defining the second memory size in the short-bus mode, where M is less than N;
    an encoder configured to map the address bits into an encoded packet forming an array having N rows and C columns, each row and column defining a cell of the packet, and each address bit of the address bits being allocated to at least one of the cells;
    said encoder also configured to arrange the address bits of the address into an encoded packet so that, in short-bus mode, the address bits defining the second memory size are transmitted over the M communications lines of the address bus; and
    a controller for generating one or more bits indicating a probe miss;
    wherein: one or more of the cells of the encoded packet further includes at least one of the probe miss bits.

2. A processor that can be connected to a memory controller which can be connected to a memory, said memory can be any of a plurality of sizes, comprising:
    a mode selector configured to select one of a long-bus mode corresponding to a first memory size and a short-bus mode corresponding to a second memory size which is less than the first memory size;
    an address bus configured to transmit an address consisting of address bits defining the first memory size and a subset of the address bits defining the second memory size;

wherein the address bus has N communication lines each configured to transmit one of a first number of bits of the address bits defining the first memory size in the long-bus mode and M of the N communication lines each configured to transmit one of a second number of bits of the address bits defining the second memory size in the short-bus mode, where M is less than N;

an encoder configured to map the address bits into an encoded packet forming an array having N rows and C columns, each row and column defining a cell of the packet, and each address bit of the address bits being allocated to at least one of the cells wherein at least one of the cells of the packet contains a bit indicating a probe miss.

3. The computing apparatus of claim 1, further comprising: said encoder configured to arrange the address bits of the address into an encoded packet so that, in short-bus mode, the address bits defining the second memory size are transmitted over the M communications lines of the address bus.

4. The computing apparatus of claim 1, further comprising:
an address generator generating the address.

5. The computing apparatus of claim 1, wherein the first memory size is a maximum memory size and the second memory size is a scaled-down memory size.

6. The computing apparatus of claim 1, further comprising:
N pins, each of the pins respectively attached to a corresponding one of the N communication lines.

7. The computing apparatus of claim 1, wherein:
one or more of the cells of the packet includes bits defining command information.

8. The computing apparatus of claim 1, wherein:
one or more of the cells of the packet includes bits defining control information.

9. A computing apparatus, comprising:
a mode selector configured to select one of a long-bus mode corresponding to a first memory size and a short-bus mode corresponding to a second memory size which is smaller than the first memory size;

an address bus configured to transmit an address consisting of address bits defining the first memory size and a subset of the address bits defining the second memory size;

wherein the address bus has N communication lines each configured to transmit one of a first number of bits of the address bits defining the first memory size in the long-bus mode and M of the N communication lines each configured to transmit one of a second number of bits of the address bits defining the second memory size in the short-bus mode, where M is less than N;

an encoder configured to map the address bits into an encoded packet forming an array having N rows and C columns, each row and column defining a cell of the packet, and each address bit of the address bits being allocated to at least one of the cells;

said encoder also configured to arrange the address bits of the address into an encoded packet so that, in short-bus mode, the address bits defining the second memory size are transmitted over the M communications lines of the address bus; and wherein at least one of the cells of the packet contains a bit indicating a probe miss.

10. The computing apparatus of claim 1, further comprising:
a time multiplexer configured to transmit the cells of the packet over the address bus in C time cycles, one of the columns of cells being transmitted during one of the C time cycles, the cells in the N rows of the one column being transmitted over the N communication lines in the one time cycle.

11. The computing apparatus of claim 1, wherein:
the mode selector is further configured to select a third memory size which is less than the first memory size;
the address bus is further configured to transmit an address consisting of a subset of the address bits defining the third memory size; and
wherein P of the N communication lines are each further configured to transmit one of a third number of bits of the address bits defining the third memory size in the short-bus mode, where P is less than N.

12. The computing apparatus of claim 2, wherein the encoded packet is divided into a plurality of parts, each part containing a portion of the address bits arranged so that the address defining the second memory size is transmitted over the N communication lines.

13. The computing apparatus of claim 12, further comprising:
a time multiplexer configured to transmit the encoded packet defining the second memory size over the M communications lines of the address bus by transmitting one of the parts per a time cycle.

14. The computing apparatus of claim 1, wherein:
while in the short-bus mode, the address is generated to a memory greater than the second memory size, this memory being denoted as non-existent memory;
a non-existent memory detection unit for detecting the address to non-existent memory; and
a handling unit for canceling the address to non-existent memory.

15. A computing apparatus configured to address multiple sized memory spaces using a minimum number of pins, comprising:
an address unit configured to generate an address consisting of address bits, the address bits defining a maximum memory and a subset of the address bits defining a small memory which is smaller than the maximum memory;
a mode selector for selecting a long-bus mode corresponding to the maximum memory or a short-bus mode corresponding to the small memory;
an address bus having N communication lines;
an encoder unit for mapping the address bits into an encoded packet having N rows and C columns, each row and column defining a cell of the packet, and each address bit of the address being placed in at least one of the cells so that the address bits defining the small memory are communicable over M of the N communication lines and the address bits defining the maximum memory are communicable over the N communication lines; and
a time multiplexer for transmitting the cells of the packet over the address bus to an external system in C time cycles, one column of the packet transmitted in each of one of the C time cycles, the cells in the N rows of each column of the packet being transmitted in parallel over the N communication lines in one of the C time cycles wherein at least one of the cells of the packet contains a bit indicating a probe miss.

16. A method of accessing memory, comprising:

selecting one of a long-bus mode corresponding to a first memory size and a short-bus mode corresponding to a second memory size which is less than the first memory size;

transmitting an address over an address bus consisting of address bits defining the first memory size and a subset of the address bits defining the second memory size, the address bus having N communication lines each configured to transmit one of a first number of bits of the address bits defining the first memory size in the long-bus mode and M of the N communication lines each configured to transmit one of a second number of bits of the address bits defining the second memory size in the short-bus mode, where M is less than N; and arranging the address bits of the address into an encoded packet forming an array having N rows and C columns, each row and column defining a cell of the packet, and each address bit of the address bits being allocated to at least one of the cells, said cells also including command and control information wherein at least one of the cells of the packet contains a bit indicating a probe miss.

17. The method of claim 16, further comprising:

arranging the address bits of the address into an encoded packet so that, in the short-bus mode, the address bits defining the second memory size are transmitted over the M communications lines of the address bus.

18. A method of accessing memory, comprising:

selecting one of a long-bus mode corresponding to a first memory size and a short-bus mode corresponding to a second memory size which is less than the first memory size;

transmitting an address over an address bus consisting of address bits defining the first memory size and a subset of the address bits defining the second memory size, the address bus having N communication lines each configured to transmit one of a first number of bits of the address bits defining the first memory size in the long-bus mode and M of the N communication lines each configured to transmit one of a second number of bits of the address bits defining the second memory size in the short-bus mode, where M is less than N; and arranging the address bits of the address into an encoded packet forming an array having N rows and C columns, each row and column defining a cell of the packet, and each address bit of the address bits being allocated to at least one of the cells;

wherein at least one of the cells of the packet contains a bit indicating a probe miss.

19. The method of claim 16, further comprising:

generating, while in the short-bus mode, an address to a memory greater than the second memory size, this memory being denoted as non-existent memory; and further comprising substeps of:

detecting the address to the non-existent memory; and canceling the detected address to the non-existent memory.

20. The method of claim 16, wherein the arranging step further includes:

partitioning the address bits to form a predetermined group of lower-order address bits and a predetermined group of higher-order address bits, wherein the address bits consisting of the concatenation of the lower-order address bits and the higher order address bits define a first address space and the lower-order address bits define a second address space;

arranging an encoded packet into C columns, each column consisting of N rows, each column and row defining a cell; and allocating a portion of the bits of the address to cells in each one of the plurality of columns, including mapping the higher-order address bits to the cells of the columns so that rows 1 to M contain the lower-order address bits forming the second address space wherein M is less than N.

21. A multiprocessor system, comprising:

a plurality of processor chips;

a main memory;

a control chip connecting the plurality of processor chips and the main memory; and wherein each processor chip comprises:

a mode selector configured to select either the main memory having a first memory size or the main memory having a second memory size which is less than the first memory size;

N pins configured to transmit an address to the control chip corresponding to the first memory size, M pins formed as a subset of the N pins configured to transmit an address to the control chip corresponding to the second memory size, where M is less than N; and an encoder configured to transform the address into an encoded packet so that the address corresponding to the first memory size transmits over the N pins to the control chip and the address corresponding to the second memory size transmits over the M pins to the control chip, where M is less than N wherein at least one of the cells of the packet contains a bit indicating a probe miss.

* * * * *

UNITED STATES PATENT AND TRADEMARK OFFICE
CERTIFICATE OF CORRECTION

PATENT NO.    : 6,199,153 B1  
DATED         : March 6, 2001  
INVENTOR(S)   : Rahul Razdan et al.

It is certified that error appears in the above-identified patent and that said Letters Patent is hereby corrected as shown below:

Column 9,  
Line 43, change "smaller" to read -- less --; and

Column 10,  
Line 23, change "the N" to read -- M of the --.

Signed and Sealed this

Eighth Day of October, 2002

*Attest:*

*Attesting Officer*

JAMES E. ROGAN  
*Director of the United States Patent and Trademark Office*